US012701817B2

(12) United States Patent
Buchholz et al.

(10) Patent No.: US 12,701,817 B2
(45) Date of Patent: Aug. 4, 2026

(54) METHOD FOR LOCAL MODIFICATION OF ETCHING RESISTANCE IN A SILICON LAYER, USE OF THIS METHOD IN THE PRODUCTION OF PASSIVATION CONTACT SOLAR CELLS AND THUS-CREATED SOLAR CELL

(71) Applicant: INTERNATIONAL SOLAR ENERGY RESEARCH CENTER KONSTANZ E.V., Constance (DE)

(72) Inventors: Florian Buchholz, Constance (DE); Jan Hoss, Constance (DE); Haifeng Chu, Constance (DE); Jan Lossen, Cologne (DE); Valentin Dan Mihailetchi, Constance (DE)

(73) Assignee: INTERNATIONAL SOLAR ENERGY RESEARCH CENTER KONSTANZ E.V., Constance (DE)

( * ) Notice: Subject to any disclaimer, the term of this patent is extended or adjusted under 35 U.S.C. 154(b) by 190 days.

(21) Appl. No.: 18/030,028

(22) PCT Filed: Oct. 7, 2021

(86) PCT No.: PCT/EP2021/077637
§ 371 (c)(1),
(2) Date: Apr. 3, 2023

(87) PCT Pub. No.: WO2022/074091
PCT Pub. Date: Apr. 14, 2022

(65) Prior Publication Data
US 2023/0369530 A1        Nov. 16, 2023

(30) Foreign Application Priority Data
Oct. 9, 2020    (EP) ..................................... 20201147

(51) Int. Cl.
*H10F 71/00*        (2025.01)
*H10F 77/20*        (2025.01)

(52) U.S. Cl.
CPC ....... *H10F 71/1221* (2025.01); *H10F 71/129* (2025.01); *H10F 77/227* (2025.01)

(58) Field of Classification Search
CPC ..... H01L 31/022425; H01L 31/022458; H01L 31/1804; H01L 31/182; H01L 31/1864; H01L 31/1868; H01L 31/1872; H10F 71/121; H10F 71/1221; H10F 71/128; H10F 71/129; H10F 71/131
See application file for complete search history.

(56) References Cited

FOREIGN PATENT DOCUMENTS

| CN | 110459615 A | 11/2019 |
| CN | 110634996 A | 12/2019 |
| CN | 110880541 A | 3/2020 |
| CN | 111628049 A | 9/2020 |
| CN | 111628050 A | 9/2020 |

*Primary Examiner* — Golam Mowla
(74) *Attorney, Agent, or Firm* — Nath, Goldberg & Meyer; Jerald L. Meyer

(57)        ABSTRACT
Provided are a method for local structuring of a silicon layer, which method comprises a step of local modification of the etching resistance within said silicon layer and a subsequent step of removing unmodified regions of said silicon layer by etching and applications of this method for the production of solar cells.

19 Claims, 3 Drawing Sheets

(10.1)

(10.2)

(10.3)

METHOD FOR LOCAL MODIFICATION OF ETCHING RESISTANCE IN A SILICON LAYER, USE OF THIS METHOD IN THE PRODUCTION OF PASSIVATION CONTACT SOLAR CELLS AND THUS-CREATED SOLAR CELL

CROSS-REFERENCE TO RELATED APPLICATIONS

This is a National Phase Application filed under 35 U.S.C. 371 as a national stage of PCT/EP2021/077637, filed Oct. 7, 2021, an application claiming the benefit of European Application No. 20201147.4 filed Oct. 9, 2020, the content of each of which is hereby incorporated by reference in its entirety.

BACKGROUND

Silicon solar cells are well-known devices for cost effective production of electric energy from sunlight. Common solar cells feature N- or P-type doped regions and their respective metal contacts on the front side and on the rear side respectively.

"Interdigitated back contact" solar cells, known as IBC solar cells, have the advantage that the solar cell is not shaded on the front side by metal contacts. The required n- and p-type doped regions and their respective metal contacts required to separate and utilize the hole and electron pairs generated by the solar irradiation are placed at the backside of the solar cell in an interdigitated fashion leaving the front side completely free from metal contacts. This enables particularly high conversion rates (efficiencies) of light into electricity to be achieved.

A common way of producing the n- and p-type regions in solar cells are homogeneous diffusion processes from gas or liquid phase or solid source creating highly doped regions inside the semiconductor. Alternatively, it has proven to be advantageous to deposit a stack of thin insulation layers with a doped polycrystalline silicon layer on top instead of in-diffusing dopants into the semiconductor obtaining so-called "passivation contacts" or "carrier selective passivation contacts".

According to the so-called TOPCon principle (wherein TOPCon is used as an abbreviation of the term "tunnel-oxide passivated contact"), a thin silicon oxide layer is first produced, on which a layer of highly doped, polycrystalline silicon formed, usually with a dielectric hydrogen providing amorphous passivation layer on top, onto which the metallization (e.g. by screen printing) is applied according to common methods. This drastically reduces the charge carrier recombination under the metal contacts and significantly increases the solar cell efficiency.

These layers have two major drawbacks: The layers show strong parasitic absorption of incident light, which does not allow them to be used on the full front side of a solar cell and, if fully transferred to the rear side of the solar cell using the IBC principle they are tedious to be structured. Most commonly, processes such as photolithography or printed mask layers are used for structuring that are costly and unsuited for large-scale mass production.

For the application of on the front side, passivated contact structures based on polycrystalline silicon layers are generally considered not to be suitable, as either only very thin layers can be applied that need the deposition of transparent conductive oxides (TCOs) to allow for sufficient lateral conductivity and do not allow standard fire-through metallization or the layers need to be structured by photolithography or printed etch masks.

For the use of polycrystalline silicon layers in IBC solar cells, three most common approaches exist and are summarized below.

1. Forming a single intrinsic polycrystalline silicon layer and subsequent structuring of doped regions by selective introduction of dopants, e.g. by screen printing (using doping pastes, as known e.g. from U.S. Pat. No. 8,802,486 B2, or etching pastes, as known e.g. from U.S. Pat. No. 7,468, 485 B1 or U.S. Pat. No. 7,851,698 B2), by laser doping (from single layers and layer stacks, as known, e.g. from U.S. Pat. No. 8,242,354B2) or by ion implantation. This is possible with and without interruption "gaps" between polarities (as disclosed in U.S. Pat. No. 8,242,354 B2 and U.S. Pat. No. 8,790,957 B2, respectively). DE102015107842B3 discloses a similar process and cell.

2. Forming a first doped polycrystalline silicon layer and subsequent deposition of an etch mask (e.g. SiO2), followed by opening of the etch mask (with etch paste, as in U.S. Pat. No. 9,196,758 B2 or using a laser, as in U.S. Pat. No. 9,196,758 B2, U.S. Pat. No. 9,837,576 B2), then the opened area is textured (potentially together with the front side). Afterwards a second doped polycrystalline silicon layer is formed on the backside, which covers the openings as well as the remaining etch mask. To prevent a short circuit between the contacts, the top layer must be laser-ablated near the contacts to avoid shunting of the cell.

3. A third variant is a so-called hybrid solar cell, in which only one of the two polarities is covered with a polycrystalline silicon layer, as described for example in U.S. Pat. No. 9,312,406 B2 and DE 10 2008 028 578 A1.

The first approach of the three, poses the problem of getting a clean separation between polarities, in most approaches an extra gap introducing step with extremely high alignment accuracy is required. The latter two options need removable etching masks, as most dielectric layers deposited on polycrystalline silicon layers need to be removed before further high temperature steps as due to different thermal expansion coefficient of the polycrystalline silicon and the capping layer, the passivation capability of the polycrystalline silicon layer is compromised.

Alternatively used etching barriers without the need to be removed such as thick silicon dioxide layers are difficult to handle as they get etched easily. Accordingly, there is a need for a simpler patterning step, which allows mask-free patterning with relaxed alignment requirements.

For the use of passivation contact layers on the front side of bifacial cells, no straight forward process sequences are known to the inventors that do not need transparent conductive oxides and allow for standard fire through metallization. The invention allows the formation of selective passivation contacts on the front side of bifacial TOPCon cells without complicating the process sequence substantially, in particular when compared to a selective emitter process sequences that also employs a laser structuring process.

SUMMARY

The problem is solved by the invention by providing a more simple way of patterning a silicon layer with relaxed alignment requirements. In a preferred embodiment, this invention uses only standard front end processing equipment, especially, e.g., no screen printing, which should allow for very high acceptance in the industry.

According to a first aspect of the invention, a method for local structuring of a silicon layer to produce locally structured polysilicon layers without the use of an etching mask is provided which relies on a local modification of the etching resistance of said layer. This method can be advantageously for local structuring of silicon layers during the production of solar cells, but is not limited to this application but generally applicable for other applications, especially in the field of semiconductor technology.

Preferably, the local modification of the etching resistance is brought about by inducing a local increase in the crystallinity of the silicon layer in the modified regions, which can be achieved e.g. by local thermal treatment or local doping.

According to a first embodiment of this aspect of the invention, which can also be transferred to the other aspects of the invention as described herein, the local modification of the etching resistance of the layer is brought about by application of a laser, more specifically application of a laser to those regions of the silicon surface in which the etching resistance is increased.

More specifically, in contrast to common laser structuring in solar cell manufacturing technology, according to this embodiment of this aspect of the invention, the laser is not used to ablate material, which destroys the integrity of the layer and leads to a layer that is no longer intact, but to change the material properties of the layer locally, specifically in such a fashion that the laser treated area can serve as an etching barrier, especially while keeping the layer intact and/or maintaining its integrity. The resulting locally structured polycrystalline silicon layer may then advantageously be utilized e.g. to serve as passivation layer for metal-silicon contacts.

According to another embodiment of this aspect of the invention, which can also be transferred to the other aspects of the invention as described herein, the local modification of the etching resistance of the layer is brought about by a local implantation of boron, which can be achieved e.g. by using a shadow mask.

According to one embodiment of this aspect of the invention, which can also be transferred to the other aspects of the invention as described herein, an increased etching resistance of the barrier in the regions that have been irradiated by the laser is reached by locally doping the layer with boron obtaining a p++ (6e19-4e20 cm-3) doped region, which leads to lower etch rates than the ones achieved in a corresponding non-doped or less doped region.

According to one embodiment of this aspect of the invention, which can also be transferred to the other aspects of the invention as described herein, the local doping and simultaneous crystallization is done by a laser from a doped silica glass layer, which has been deposited in-situ (in the same machine as the silicon layer) or ex-situ in a different machine (such as by APCVD, PECVD or in a tube furnace), or from a further, highly doped amorphous Si layer. The laser step is preferably performed with an excimer laser (similar to the one used in the production of TFT displays) or by scanning with a short pulse laser (e.g. a green nanosecond laser).

According to an embodiment of this aspect of the invention, which can also be transferred to other aspects of the invention, subsequent alkaline etching (e.g. using preferably hot KOH, NaOH, TMAH or similar of various concentrations, optionally containing etch rate modifying additives) selectively removes the non-actively doped (and crystallized) silicon layer. The alkaline etch step can be an alkaline texturing step using conventional methods (in dilute hot alkali using common texture additives). Alternatively, the surface can be etched smooth by the usual method in hot, more concentrated alkaline solution to form a step.

According to a second aspect of this invention, a method for the production of silicon solar cells is provided, said method comprising at least one step of local structuring of a silicon layer without the use of an etching mask that is based on a local modification of the etching resistance of said layer.

According to one preferred embodiment of this aspect of the invention, local modification of the etching resistance is induced using a laser to change the material properties of at least one layer in such a fashion that the laser treated area can serve as an etching barrier. As stated above, the laser is not used to ablate material, which destroys the integrity of the layer and leads to a layer that is no longer intact, but to change the material properties of the layers, preferably the crystallinity or doping concentration of the layer, locally. The laser treated area can thus serve as an etching barrier, especially while keeping the layer intact and/or maintaining its integrity.

In an embodiment of this aspect of the invention, as a starting substrate a silicon wafer, the saw damage of which was removed by conventional methods and which was then cleaned, is provided.

In an embodiment of this aspect of the invention, a stack of layers is first deposited onto said silicon wafer by a conventional method (e.g. by oxidation, PECVD, LPCVD, CVD, sputtering or a mix of the named methods), which consists of a thin oxide layer, an undoped silicon layer and a dopant layer, preferably a borosilicate glass layer (BSG).

With the aid of a laser, e.g. an eximer laser or a visible light or ultraviolet short pulse laser, wherein a short pulse laser according to this disclosure is a nanosecond-, picosecond- or femtosecond-laser, the intrinsic layer produces a highly doped (p++) region wherever the metal contact for the p-polarity is applied at the end of the process.

In some embodiments of this aspect of the invention, the solar cell is a two side contacted solar cell and the method according to the first aspect of the invention one of claims 1 to 9 is used to produce localized passivation contact layers, to serve as passivation layer for the metal contacts on the front side of the solar cell without the drawback of additional parasitic absorption.

Specifically, in some of these embodiments of the invention it may be preferable if the regions between places, on which local modification of the etching resistance within said silicon layer has been performed, are homogenously doped with the same doping type as the passivation layer.

In some other embodiments of this aspect of the invention, the solar cell is an IBC solar cell and the method according to the first aspect of the invention one of claims 1 to 9 is used to either produce localized passivation layers or so-called carrier selective passivation contacts in an interdigitated structure on the rear side.

BRIEF DESCRIPTION OF THE DRAWINGS

Next, the invention is explained in more detail assisted by figures, which represent specific embodiments of the invention. Note that none of the dimensions in the figures is to scale.

The figures show.

DETAILED DESCRIPTION

In the present disclosure relating to specific embodiments of the invention, numerous specific details are provided, such as examples of materials, process parameters, process steps, and structures, to provide a thorough understanding of the invention. However, persons skilled in the art of solar cell manufacturing will be aware of alternatives that allow realization of the invention. In some instances, well-known details are not shown or described in detail to avoid obscuring the focus on invention.

The presented invention utilizes material properties and changes in material properties that can be characterized using well known methods. The invention relates to a combination of process steps that are used to change the material properties in a way that allows to produce highly efficient solar cells in a cost effective manner.

In all of the embodiments of the invention, a silicon layer is structured locally without the use of an etching mask. The resulting layer can then be utilized to serve as passivation layer for metal-silicon contacts. In contrast to common laser structuring in solar cell manufacturing technology, the laser is not used to ablate material, but quite the opposite. Where the laser is applied the material properties of the layers are changed in such a fashion that the laser treated area can serve as an etching barrier.

Figures 1, 2:
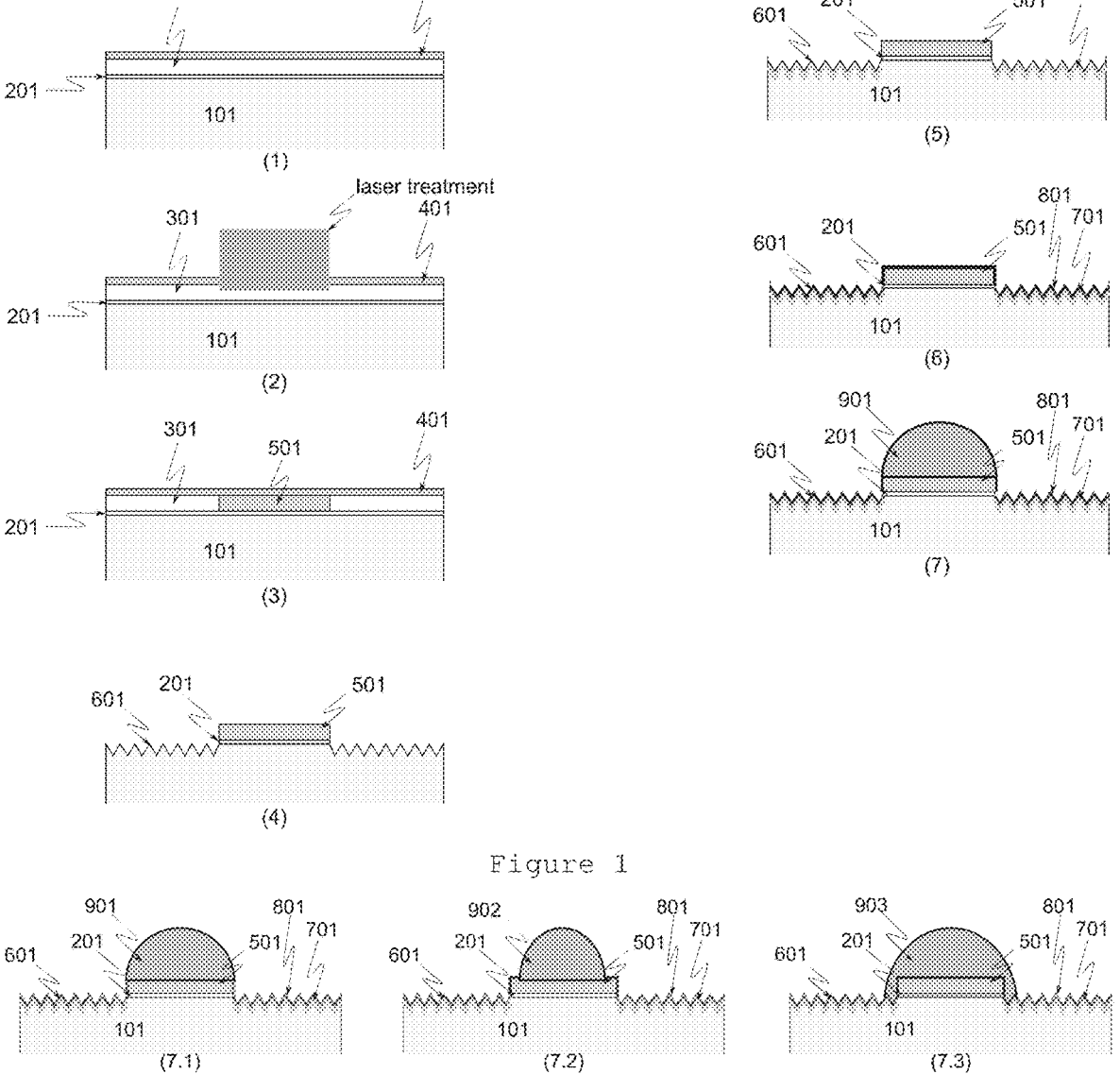
FIG. 1: The process flow of a process sequence showing essential steps of the preparation of the front side of a TOPCon solar cell with selective passivation contact structures on the front side during the production of the TOPCon solar cell.
FIG. 2: a variety of alternatives for the relative widths of laser treated region and metallization finger obtained after the last processing step in FIG. 1, FIG. 3: the process flow of a process sequence showing essential steps of the formation of a passivation contact IBC solar cell with a focus on the processing of the rear side.

One way for obtaining this etching resistance of the layer that is disclosed in detail is locally doping the layer with boron obtaining a p++(6e19-4e20 cm-3) doped region that etches slower than a non-doped or lower doped or n+ doped region (see. FIG. 1). The starting substrate is a silicon wafer, the saw damage of which was removed by conventional methods and which was then cleaned. In one version of the invention, a stack of layers is first deposited by a conventional method (e.g. by oxidation, PECVD, LPCVD, CVD, sputtering or a mix of the named methods), which consists of a thin oxide layer, an intrinsic Si layer and a dopant layer, preferably a borosilicate glass layer (BSG). With the aid of a laser, e.g. an eximer laser or a green or ultraviolet nanosecond-, picosecond- or femtosecond-laser, the intrinsic layer produces a highly doped (p++) region wherever the metal contact for the p-polarity is applied at the end of the process.

Using a partly crystalline layer, such as would be resulting from LPCVD depositions, the p++ doped layer was found to etch by a factor of about 100 to 500 slower as the non-doped region and the silicon underneath. This allows for alkaline texturing of the silicon as deep as several micrometers, while only some tens of nanometers of the doped layers are removed. If amorphous layers are used, local n++ doping can also be used. Different etch rates then do not result from the difference of the dopant concentration and different crystallinity, but only from the different crystallinity.

Following this invention, also local implantation of boron, e.g. by a shadow mask can be considered. In this case no dopant source layer and laser is necessary to obtain the doped region that can then serve as etching barrier.

More preferably, the local doping and simultaneous crystallization is done by a laser from a source layer of doped silicate glass layer, which has been deposited in-situ (in the same machine as the silicon layer) or ex-situ in a different machine (such as by APCVD or in a tube furnace or PECVD), or from a further, highly doped amorphous Si layer. The laser step is preferably performed with an excimer laser (similar to the one used in the production of TFT displays) or by scanning with a short pulse laser (e.g. a green nanosecond laser). Nevertheless, other methods are also conceivable, by which the layer is heated locally so strongly that dopants are incorporated and their crystallinity is increased.

Subsequent alkaline etching (e.g. using preferably hot KOH, NaOH, TMAH or similar of various concentrations) selectively removes the non-actively doped (and crystallized) silicon layer.

The alkaline etch step can be an alkaline texturing step using conventional methods (in dilute hot alkali using common texture additives). Alternatively, the surface can be etched smooth by the usual method in hot, more concentrated alkaline solution to form a step.

FIG. 1 shows a process flow for producing a TOPCon cell with selective passivation contact structures on the front side of the solar cell. The different stages of the process are marked by bracketed numbers, which are also used in the following description of the process flow.

This process sequence only describes the preparation of the front side of the solar cell. Rear side production processes are omitted for clarity but can be easily added based on the knowledge of a person skilled in the art. Also not displayed are process steps such as single side polishing and the deposition of a second poly layer on the rear side of the cell, or doping (and crystallization) of the same intrinsic layer with an opposite doping type on the rear side of the solar cell, which may be useful in certain embodiments of the invention. Further, the drawing is not to scale. Thickness of layers is typically in the range of tens of to hundreds of nanometers while width of doped region and metal finger is typically in the range of few micrometers to about hundred micrometers.

The solar cell possesses a light facing side (also referred to as front side) and an opposing side (also referred to as rear side).

(1) Onto a preprocessed silicon wafer 101 of either n- or p-type that has been saw damage etched and cleaned using conventional etching and cleaning techniques, a thin oxide layer 201 is grown or deposited (e.g. by heating in oxygen containing atmosphere or by immersing into oxidants containing solutions). An intrinsic silicon layer 301 (which represents the layer to be locally modified) and a doping source layer 401 are deposited.

(2) A laser is used to dope and crystallize local areas of 301.

(3) By the laser treatment the highly doped area 501 with increased crystallinity is formed in the regions that are irradiated by the laser.

(4) After removal of the doping source layer 401 in a suitable etchant, an alkaline etching step (in this case a texturing step producing random pyramids) forms an alkaline etched surface 601.

(5) This surface is subsequently doped creating a doped region 701 of the same polarity as 501 but with lower dopant concentration using a conventional doping process such as tube furnace diffusion.

(6) Onto 501 and 601 an antireflective coating 801 (e.g. SiNx) is formed by conventional methods such as PECVD.

7

8

(7) Last, a metallization finger 901 is applied using a conventional solar cell metallization process, such as screen printing of metal paste or plating.

As shown in FIG. 2, the width of the laser treated region and or the width of the metallization finger may vary to achieve minimum parasitic absorption and best alignment with the metallization process. Ideally, the two widths match perfectly as in configuration (7.1) of FIG. 2. Yet, to ease the need for alignment also slightly wider laser treated areas, as in configuration (7.2) of FIG. 2 or wider metallization fingers 901, 902, 903 as in configuration (7.3) of FIG. 2 are conceivable. Further also for partly misaligned metal fingers, in which the metal is only partly on top of layer 501, would work.

Figure 3:
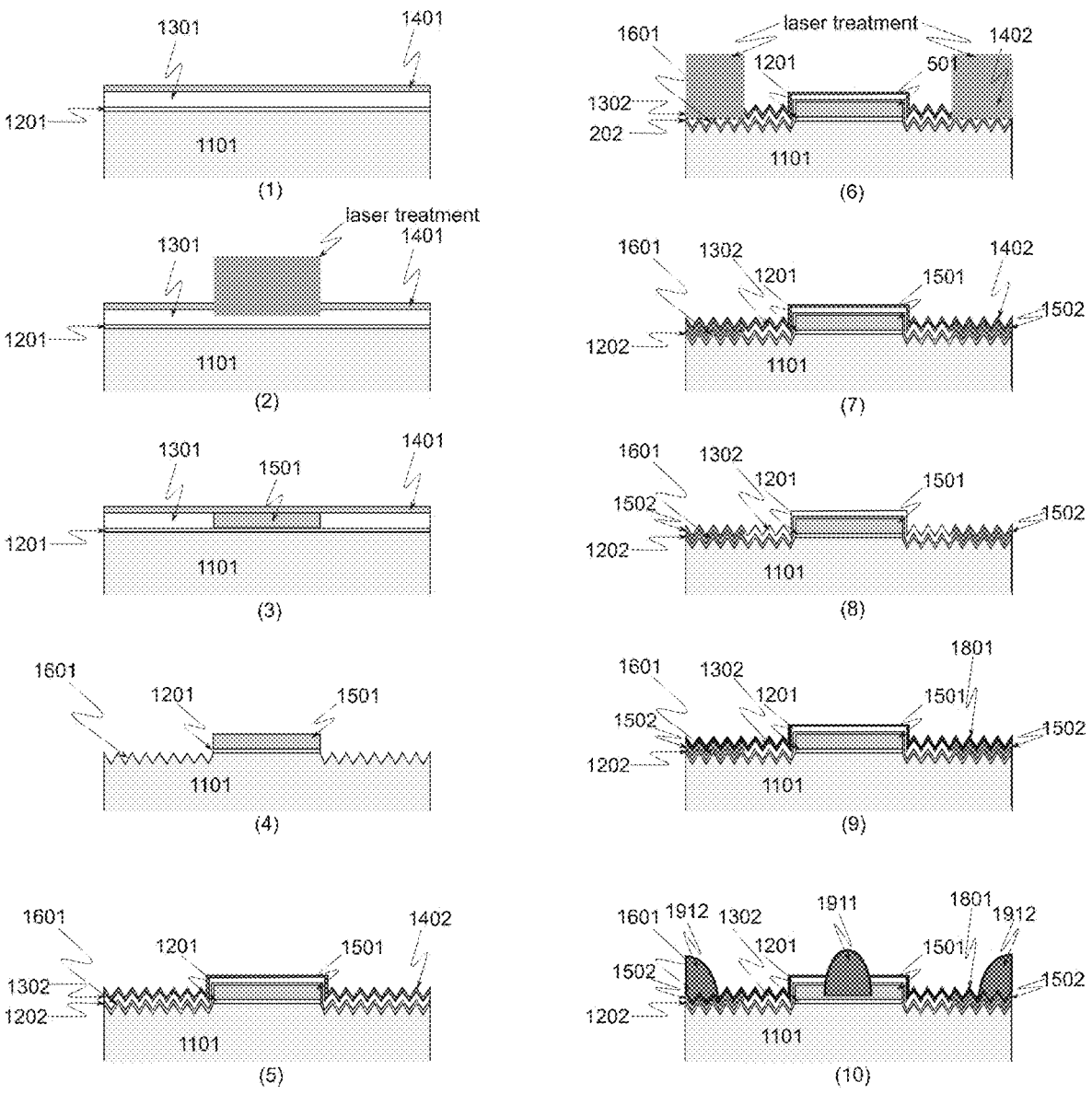

FIG. 3 shows a second embodiment of the invention, a solar cell process sequence for a passivation contact IBC solar cell being disclosed. As in the embodiment of FIG. 1, not all the process steps that are required to process the functional solar cell are shown for reasons of simplicity. A person skilled in the art of solar cell production will easily notice that for example upon alkaline texturing for the gaps in the rear side also the front side may be textured in the same step. Also, the formation of the second doping source layer may be used for doping the front side of the solar cell. The focus in the description of the second embodiment of the invention lies on the processing of the rear side.

(1) Onto a preprocessed silicon wafer 1101 of either n- or p-type that has been saw damage etched and cleaned using conventional etching and cleaning techniques, a thin oxide layer 1201 is grown or deposited (e.g. by heating in oxygen containing atmosphere or by immersing into oxidants containing solutions). An intrinsic silicon layer 1301 and a doping source layer 1401 are deposited.

(2) A laser is used to dope and crystallize local areas of 1301.

(3) By the laser treatment the highly doped area 1501 with increased crystallinity is formed in the regions that are irradiated by the laser.

(4) After removal of the doping source layer 1401 in a suitable etchant, an alkaline etching step (in this case a texturing step producing random pyramids) forms an alkaline etched surface 1601.

(5) Onto that wafer surface a second thin oxide layer 1202 is grown or deposited (e.g. by heating in oxygen containing atmosphere or by immersing into oxidants containing solutions). A second intrinsic silicon layer 1302 and a doping source for opposite dopant layer 1402 are deposited.

(6) Similar to (2) a laser is used to produce a second highly doped layer 1502 of the second polarity. The non-doped gap between the polarities should be minimized for best passivation quality, yet remain large enough to get good reverse current behavior.

(7) Shows the structure after the second lasering step.

(8) Next the dopant source layer is removed. In one embodiment, also the intrinsic, non-treated region may be removed following the disclosed principle of this invention (not shown).

(9) A capping layer 1801 is deposited on top.

(10) The metallization of the two polarities 1911 and 1912 is applied using a conventional solar cell metallization process, such as screen printing of metal paste or plating.

Figure 4:
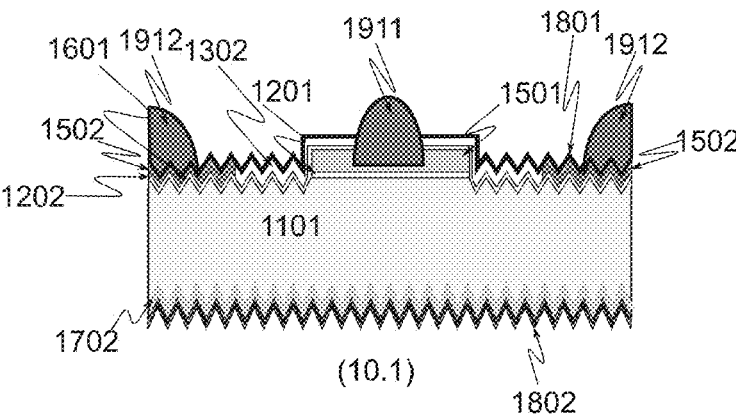
FIG. 4: a variety of alternatives for the structure of the rear side of the solar cell obtained after the last processing step in FIG. 3.
Figure 4:
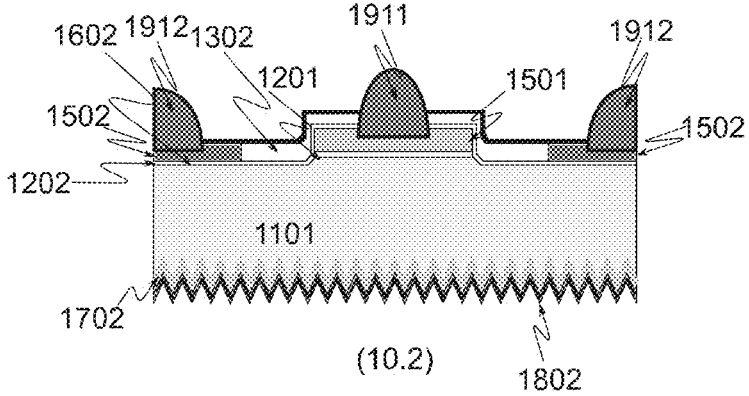
Figure 4:
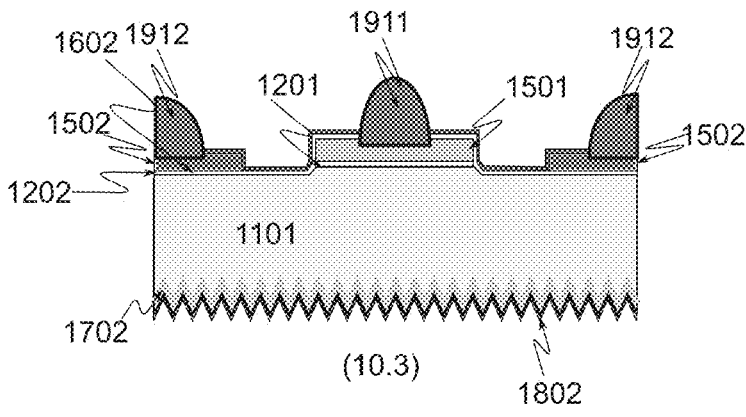

As stated beforehand, instead of alkaline texturing, also alkaline etching without additive producing flat surfaces may be used the resulting process sequence, from (1)-(5) changes only slightly. In addition, as mentioned above, the non-treated region in the second Si-layer may be etched, if for the second polarity the crystallization of an amorphous layer is employed. Several possible different embodiments of the inventions are schematically drawn in FIG. 4. In all case the front side (facing downwards in the drawing) is textured, diffused 1702 and anti-reflective coated 1802.

REFERENCE NUMERALS

101,1101 wafer
201,1201,1202 oxide layer
301,1301,1302 silicon layer
401,1401,1402 doping source layer
501,1501,1502 doped region (in laser treated areas)
601,1601 alkaline etched surface
701,1701,1702 doped region (between laser-treated areas)
801,1801,1802 antireflective coating
901,902,903,1911,1912 metallization finger

The invention claimed is:

1. A method for local structuring of a silicon layer to produce locally structured polycrystalline layers (301,1301, 1302), characterized in that the method comprises a step of local modification of the etching resistance within said silicon layer (301,1301, 1302) and a subsequent step of removing unmodified regions of said silicon layer (301,1301,1302) by etching, wherein the local modification of the etching resistance of the silicon layer (301,1301,1302) is brought about at least partly by application of a laser to those regions of the silicon layer (301,1301,1302) in which the etching resistance is increased, wherein the local modification of the etching resistance is brought about at least partly by inducing a local increase in the crystallinity of the silicon layer (301, 1301,1302) in the modified regions to produce locally structured polycrystalline layers, and wherein the laser that is used is a short pulse ultraviolet light laser, and wherein the pulse energy is being selected such that a local increase in the crystallinity of the silicon layer (301,1301,1302) and diffusion or activation of dopants, in case dopants are present, occurs, but an underlying layer remains unaffected.

2. The method according to claim 1, wherein the silicon layer (301,1301,1302) as deposited is amorphous, partly crystalline or completely crystalline.

3. The method according to claim 1, wherein the pulse energy is being selected such that a local increase in the crystallinity of the silicon layer (301,1301,1302) and diffusion or activation of dopants, in case dopants are present, occurs, but an underlying layer remains unaffected.

4. The method according to claim 1, wherein the local modification of the etching resistance of the silicon layer (301,1301,1302) is brought about at least partly by local doping.

5. The method according to claim 4, wherein the doping source is a doping source layer (401,1401,1402) formed by a highly doped amorphous silicon layer or a dopant-containing a borosilicate glass layer.

6. The method according to claim 1, wherein the local modification of the etching resistance of the silicon layer (301,1301,1302) is brought about at least partly by local doping by implantation of boron.

7. The method according to claim 4, wherein the doping source is a doping source layer (401,1401,1402) formed by a highly doped amorphous silicon layer or a dopant-containing silicate glass layer.

8. The method according to claim 7, wherein the silicon layer (301,1301,1302) and the doping source layer (401, 1401,1402) are successively created in the same process chamber.

9. The method according to claim 4, wherein local doping is obtained by ion implantation using a shadow mask.

10. The method according to claim 1, wherein the subsequent step of removing unmodified regions of said silicon layer (301,1301,1302) by etching takes place in alkaline solution.

11. The method according to claim 1, wherein the subsequent step of removing unmodified regions of said silicon layer (301,1301,1302) by etching takes place in alkaline solution in a concentration range between 1 and 40%.

12. A method for the production of silicon solar cells, said method comprising at least one step of local structuring of the silicon layer (301,1301,1302) according to claim 1.

13. The method according to claim 12, wherein as a starting substrate a silicon wafer (101, 1101), the saw damage of which was removed and which was then cleaned, is provided.

14. The method according to claim 13, wherein a stack of layers is first deposited onto said silicon wafer (101,1101) which stack comprises an oxide layer (201,1201,1202), an undoped silicon layer (301,1301,1302) and a dopant layer (401,1401,1402) on top of the undoped silicon layer (301, 1301,1302).

15. The method according to claim 14, wherein a laser is applied to produce a highly doped (p++) region (501,1501, 1502) in the undoped silicon layer (301,1301,1302) and wherein at parts of the locations where the laser has been applied a metal contact for the extraction of positive charge carriers is created in a later process step.

16. The method according to claim 1, wherein the solar cell is a two side contacted solar cell, further comprising producing localized passivation layers for passivation the contacts on the front side of the solar cell.

17. The method according to claim 16, wherein the regions between places, at which local modification of the etching resistance within said silicon layer (301,1301,1302) has been performed, are homogenously doped with the same doping type as the passivation layer.

18. The method according to claim 1, wherein the solar cell is an IBC solar cell, further comprising producing localized passivation layers or passivation contacts in an interdigitated structure on the rear side, wherein the subsequent step of removing unmodified regions of said silicon layer (301,1301,1302) by etching takes place in alkaline solution.

19. A method for local structuring of a silicon layer to produce locally structured polycrystalline layers (301,1301, 1302), characterized in that the method comprises a step of local modification of the etching resistance within said silicon layer (301,1301, 1302) and a subsequent step of removing unmodified regions of said silicon layer (301,1301,1302) by etching, wherein the local modification of the etching resistance of the silicon layer (301,1301,1302) is brought about at least partly by application of a laser to those regions of the silicon layer (301,1301,1302) in which the etching resistance is increased, wherein the local modification of the etching resistance is brought about at least partly by inducing a local increase in the crystallinity of the silicon layer (301, 1301,1302) in the modified regions to produce locally structured polycrystalline layers, and wherein the laser that is used is a short pulse ultraviolet light excimer laser, and wherein the pulse energy is being selected such that a local increase in the crystallinity of the silicon layer (301,1301,1302) and diffusion or activation of dopants, in case dopants are present, occurs, but an underlying layer remains unaffected.

* * * * *